United States Patent
Aderhold

(10) Patent No.: US 9,245,768 B2
(45) Date of Patent: Jan. 26, 2016

(54) METHOD OF IMPROVING SUBSTRATE UNIFORMITY DURING RAPID THERMAL PROCESSING

(71) Applicant: Applied Materials, Inc., Santa Clara, CA (US)

(72) Inventor: Wolfgang R. Aderhold, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 220 days.

(21) Appl. No.: 14/109,419

(22) Filed: Dec. 17, 2013

(65) Prior Publication Data

US 2015/0170934 A1  Jun. 18, 2015

(51) Int. Cl.
*H01L 21/324* (2006.01)
*H01L 21/66* (2006.01)
*H01L 21/67* (2006.01)

(52) U.S. Cl.
CPC ........ *H01L 21/324* (2013.01); *H01L 21/67115* (2013.01); *H01L 21/67248* (2013.01); *H01L 21/67288* (2013.01); *H01L 22/12* (2013.01); *H01L 22/26* (2013.01)

(58) Field of Classification Search
None
See application file for complete search history.

(56) References Cited

U.S. PATENT DOCUMENTS

| | | | | |
|---|---|---|---|---|
| 6,164,816 A * | 12/2000 | Aderhold | ............... | G01J 5/0003 356/43 |
| 6,828,163 B2 * | 12/2004 | Kobayashi | ............. | G01B 21/30 257/E21.53 |
| 7,860,379 B2 | 12/2010 | Hunter et al. | | |
| 7,889,810 B2 | 2/2011 | Ahmed et al. | | |
| 8,104,951 B2 | 1/2012 | Aderhold et al. | | |
| 8,109,669 B2 | 2/2012 | Aderhold et al. | | |
| 2003/0203517 A1 * | 10/2003 | Suzuki | ................ | H01L 21/8238 438/14 |
| 2007/0128780 A1 | 6/2007 | Aderhold et al. | | |
| 2008/0131679 A1 * | 6/2008 | Nakai | ..................... | C30B 29/06 428/218 |
| 2008/0286885 A1 * | 11/2008 | Izikson | .................. | G05B 21/02 438/7 |
| 2009/0278287 A1 * | 11/2009 | Wang | ................. | B23K 26/0066 264/485 |
| 2010/0124249 A1 * | 5/2010 | Aderhold | ............. | G01J 5/0003 374/124 |
| 2010/0261298 A1 * | 10/2010 | Kirkpatrick | ....... | H01L 21/02532 438/16 |
| 2011/0123178 A1 | 5/2011 | Aderhold et al. | | |
| 2012/0308215 A1 * | 12/2012 | Li | ........................ | F27B 17/0025 392/416 |
| 2013/0052756 A1 * | 2/2013 | Okujo | ............... | H01L 21/67248 438/7 |
| 2013/0306871 A1 * | 11/2013 | Cibere | .............. | H01L 21/67115 250/340 |
| 2014/0045321 A1 * | 2/2014 | Sucher | .............. | H01L 21/02238 438/478 |
| 2014/0141538 A1 * | 5/2014 | Hawryluk | ............... | G01B 11/24 438/7 |

* cited by examiner

*Primary Examiner* — Michael Jung
(74) *Attorney, Agent, or Firm* — Patterson & Sheridan, LLP

(57) ABSTRACT

Methods for controlling substrate uniformity in a thermal processing chamber include a measuring process to provide temperature-related quantities across a radius of a substrate, correlating substrate properties with processing parameters to simulate deformation of the substrate at various radial distances over a temperature range, a thermal process so that temperature of at least one reference region within the substrate matches a target set point temperature, measuring a temperature of at least one reference region as the substrate rotates, measuring deformation of the substrate as the substrate rotates, correlating measured temperatures of at least one reference region with simulated deformation of the substrate and measured temperature-related quantities of the substrate to calculate a simulated shape change of the substrate over a temperature range, tuning substrate flatness by adjusting lamp temperature profile across the substrate based on simulated shape change of the substrate and actual shape of the substrate.

19 Claims, 3 Drawing Sheets

METHOD OF IMPROVING SUBSTRATE UNIFORMITY DURING RAPID THERMAL PROCESSING

BACKGROUND

1. Field

Embodiments of the present invention generally to the field of semiconductor processing. More specifically, embodiments of the invention are directed to methods for improving substrate uniformity across a surface of the substrate during thermal processing.

2. Description of the Related Art

Rapid thermal processing (RTP) is a process for annealing substrates during semiconductor processing. During RTP, thermal radiation is generally used to rapidly heat a substrate in a controlled environment to a high temperature such as about 1200° C. This high temperature is maintained for a specific amount of time ranging from less than one second to several minutes depending upon the process. The substrate is then cooled to room temperature for further processing.

RTP usually requires a substantially uniform temperature profile across the substrate. Temperature uniformity in the substrate is necessary to prevent thermal stress-induced substrate damage such as warpage, defect generation and slip. Particularly given the submicron dimensions of current devices, to obtain high yields and process reliability, the temperature of the substrate must be precisely controlled during these thermal processing steps. For example, to fabricate a dielectric layer 60-80 Å thick with a uniformity of ±2 Å, the temperature in successive processing runs cannot vary by more than a few degrees Celsius from the target temperature. To achieve this level of temperature control, the temperature of the substrate is typically measured in real time and in situ.

Optical pyrometry is a technology that is used to measure substrate temperatures in RTP systems. An optical pyrometer using an optical probe samples the emitted radiation intensity from the substrate, and computes the temperature of the substrate based on the spectral emissivity of the substrate and the ideal blackbody radiation-temperature relationship. A computerized controller receives the outputs of the pyrometers and accordingly controls the voltages supplied to the lamps in different zones to thereby tailor the radial distribution of radiant energy. One difficulty encountered in the use of pyrometers for measuring substrate temperature in an RTP system is that variations between individual temperature sensors and differences in their position with respect to a particular substrate in the chamber can affect the accuracy of the temperature measurements. Therefore, substrate temperature measurements obtained from the sensors can have an unknown error component attributable to such variations. Those variations show up, for example, as differences in the thickness of a deposited layer across the substrate surface because the sensors are used as part of the closed-loop temperature control.

One way to address errors in temperature measurements is to reduce or increase a temperature offset at the location of the temperature deviation. Such a technique assumes localized heating from the heat source. However, due to cross-coupling between lamp zones, thermal discontinuities at the substrate edge, and the viewing angle of the probes, such an assumption generally is not valid. Thus, additional techniques are required for obtaining accurate substrate temperature measurements to provide uniform processing conditions across the substrate surface.

Therefore, there is a need for methods used in RTP for improved substrate uniformity.

SUMMARY

Methods for controlling substrate uniformity in a thermal processing chamber are described. In one embodiment, the method includes performing a measuring process to provide one or more temperature-related quantities across a radius of a substrate, correlating substrate properties with processing parameters to simulate deformation of the substrate at various radial distances over a temperature range, performing a thermal process so that temperature of at least one reference region within the substrate matches a target set point temperature, measuring a temperature of at least one reference region within the substrate as the substrate rotates, measuring deformation of the substrate of at least the reference region within the substrate and a region of the substrate different than the reference region as the substrate rotates, correlating measured temperature values of at least one reference region with simulated deformation of the substrate and measured temperature-related quantities of the substrate to calculate a simulated shape change of the substrate over a temperature range, and tuning substrate flatness by adjusting lamp temperature profile across the substrate based on the simulated shape change and measured deformation of the substrate.

In another embodiment, the method includes performing a measuring process to determine an initial surface topography of a substrate, calculating a simulated deformation profile for the substrate over a temperature range based on the initial surface topography of the substrate and substrate properties, matching temperature of a reference region within the substrate to a target set point temperature during a thermal process, calculating a simulated shape change of the substrate based on a temperature measurement of the reference region and the simulated deformation profile, and tuning substrate flatness by adjusting lamp temperature profile across the substrate based on the simulated shape change of the substrate.

In yet another embodiment, the method includes performing a measuring process to provide temperature-related quantities across a radius of a substrate, correlating substrate properties with processing parameters to simulate deformation of the substrate at various radial distances over a temperature range, performing a thermal process so that temperature of at least one reference region within the substrate matches a target set point temperature, measuring a temperature of at least one reference region within the substrate as the substrate rotates, measuring deformation of the substrate of at least the reference region within the substrate and a second region of the substrate different than the reference region as the substrate rotates, correlating measured temperature values of at least one reference region with simulated deformation of the substrate and measured temperature-related quantities of the substrate to calculate a simulated shape change of the substrate over a temperature range, tuning substrate flatness by adjusting lamp temperature profile across the substrate based on simulated shape change of the substrate and based on measuring devices for determining the actual shape of the substrate during the thermal process, and using a control system to maintain the simulated shape change.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
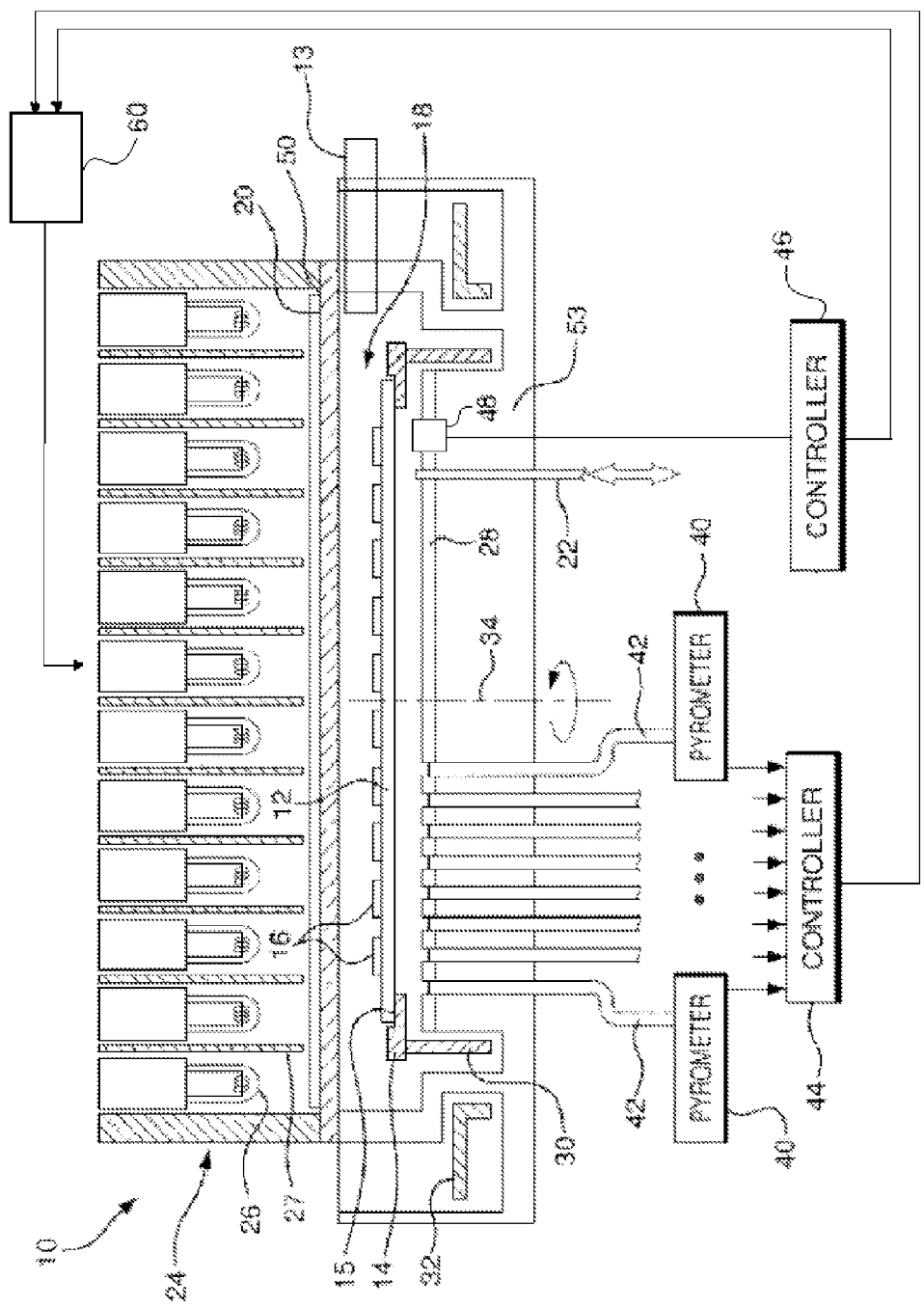
FIG. 1 is a simplified schematic view of an exemplary rapid thermal processing (RTP) chamber that may be used to practice embodiments of the present invention.

To facilitate understanding, identical reference numerals have been used, wherever possible, to designate identical elements that are common to the figures. It is also contemplated that elements disclosed in one embodiment may be beneficially utilized on other embodiments without specific recitation.

DETAILED DESCRIPTION

Exemplary Thermal Processing Chamber

FIG. 1 is a simplified schematic view of an exemplary rapid thermal processing (RTP) chamber 10 that may be used to practice embodiments of the present invention. A substrate or wafer 12, for example, a semiconductor wafer such as a silicon wafer to be thermally processed is passed through the valve or access port 13 into the process area 18 of the chamber 10. The wafer 12 is supported on its periphery by a substrate support shown in this embodiment as an annular edge ring 14 having an annular sloping shelf 15 contacting the edge of the wafer 12. The edge ring 14 is disposed on a rotatable cylinder 30 that is magnetically coupled to a rotatable flange 32 positioned outside the chamber. A rotor (not shown) rotates the flange 32 and hence rotates the wafer about its center 34.

The wafer is oriented such that processed features 16 already formed in a frontside of the wafer 12 face upwardly, referenced to the downward gravitational field, toward a process area 18 defined on its upper side by a transparent quartz window 20. The transparent quartz window 20 is located a substantial distance from the wafer 12 such that window has minimal effect on cooling of the substrate during processing. Typically, the distance between the wafer 12 and the window 20 is on the order of 20 mm. Three lift pins 22 may be raised and lowered to support the back side of the wafer 12 when the wafer is handed between a paddle or robot blade (not shown) bringing the wafer into the chamber and onto the edge ring 14. A radiant heating apparatus 24 is positioned above the window 20 to direct radiant energy toward the wafer 12 and thus to heat it. In the reactor or processing chamber 10, the radiant heating apparatus includes a large number, 409 being an exemplary number, of high-intensity tungsten-halogen lamps 26 positioned in respective reflective tubes 27 arranged in a hexagonal close-packed array above the window 20. The array of lamps 26 is sometimes referred to as the lamphead. As used herein, the term lamp is intended to cover lamps including an envelope that surrounds a heat source. The "heat source" of a lamp refers to a material or element that can increase the temperature of the substrate, for example, a filament or gas that can be energized.

It is important to control the temperature across the wafer 12 to a closely defined temperature uniform across the wafer 12. One passive means of improving the uniformity includes a reflector 28 extending parallel to and over an area greater than the wafer 12 and facing the back side of the wafer 12. The reflector 28 efficiently reflects heat radiation emitted from the wafer 12 back toward the wafer 12. The reflector 28 can be deposited on a water-cooled base 53 made of metal to heat sink excess radiation from the wafer, especially during cool down.

Another way of improving the uniformity divides the lamps 26 into zones arranged generally ring-like about the central axis 34. Control circuitry varies the voltage delivered to the lamps 26 in the different zones to thereby tailor the radial distribution of radiant energy. Dynamic control of the zoned heating is affected by, one or a plurality of pyrometers 40 coupled through one or more optical light pipes 42 positioned to face the back side of the wafer 12 through apertures in the reflector 28 to measure the temperature across a radius of the rotating wafer 12. A first controller 44 receives the outputs of the pyrometers 40 and accordingly controls the voltages supplied to the different rings of lamps 26 through a multi-zone lamp driver 60 to thereby dynamically control the radiant heating intensity and pattern during the processing.

As will be discussed in more detail below with respect to FIG. 4, a second controller 46 may receive measured values related to wafer flatness from a measurement device 48 and control the voltages supplied to the different rings of lamps 26 through the multi-zone lamp driver 60 based on the measured values and predetermined film parameters to keep the substrate flat over a temperature range during the processing. The measurement device 48 may be a laser interferometer or any suitable device that is capable of measuring the flatness of the substrate at the backside. Suitable measuring device or technology may include, but is not limited to optical flatness measurements, laser displacement measurements, ultrasonic displacement measurements, or a contact type displacement meter based on measurements of vertical displacement of contact pins or other elements on a tool brought into contact with the substrate, or measurements of the change in capacitance between the substrate and a measurement tool.

It will be understood that the configuration shown in FIG. 1 is not intended to be limiting. In particular, the invention is not limited to configurations in which the heat source or lamps are directed at one side or surface of the substrate and the pyrometers are directed at the opposite side of the wafer.

Exemplary Rapid Thermal Process

Figure 2:
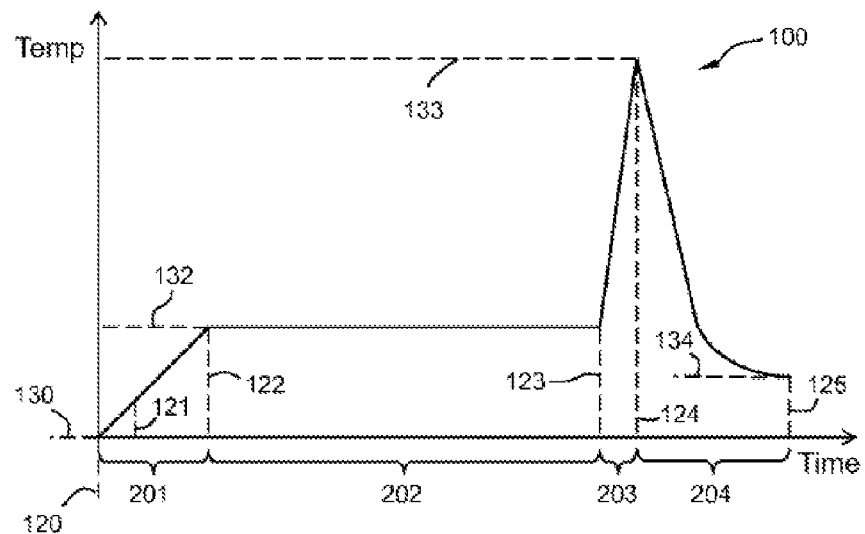
FIG. 2 illustrates an ideal time-temperature trajectory for an exemplary rapid thermal process.

FIG. 2 illustrates an ideal time-temperature trajectory, hereinafter referred to as target time-temperature trajectory 100 for an exemplary rapid thermal process, in this case a spike anneal process. The abscissa represents time, the ordinate represents substrate temperature, and target time-temperature trajectory 100 represents the desired temperature of a substrate at any time during the spike anneal process. At time 120, thermal processing of the substrate begins with the substrate at temperature 130, which is substantially room temperature. The substrate temperature is increased to temperature 132 using high-intensity lamps during initial temperature ramp 301, described below in conjunction with FIG. 3. Starting at time 122, the substrate temperature is held constant at temperature 132 for the duration of stabilization period 302. At time 123 the substrate temperature is quickly increased to peak temperature 133 at time 124 and then immediately reduced to temperature 134 at time 125.

Figure 3:
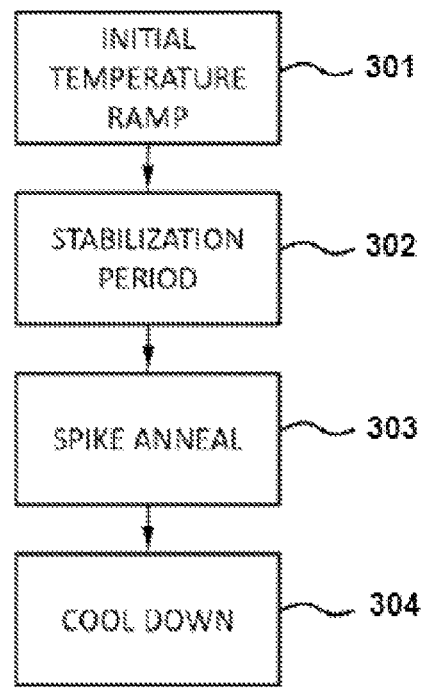
FIG. 3 is a flow chart illustrating an exemplary process sequence for a rapid thermal process.

FIG. 3 is a flow chart illustrating a typical process sequence 200 for a rapid thermal process, such as the spike anneal process described above in conjunction with FIG. 2. Generally, such a process begins with an initial temperature ramp 301 of the substrate. Until the substrate is at a temperature of about 300° C. to about 400° C., open-loop heating is performed during the first segment of initial temperature ramp 301. Referring back to FIG. 2, open-loop heating takes place between time 120 and 121. During open-loop heating, there may be no substrate temperature feedback incorporating into controlling the process and instead lamp power is applied to the substrate at pre-determined values for a pre-determined duration in order to heat the substrate to a temperature regime in which the substrate will be substantially opaque to the majority of lamp energy being applied to it. Below about 300° C., a typical RTP substrate, such as a silicon wafer, is largely transparent to much of the radiant energy produced by typical heating lamps. When this is the case, radiant energy that passes through the substrate may then be detected by the pyrometers that measure substrate backside temperature, producing an inaccurate substrate temperature measurement. For a closed-loop heating control algorithm, inaccurate substrate temperature measurement may result in serious control problems during the initial temperature ramp 301, such as instability and/or hunting. Open-loop heating may be used at the beginning of RTP to avoid this problem. The set points for open-loop heating are generally determined empirically.

After the substrate is heated to between about 300° C. to about 400° C., the initial temperature ramp 301 is then generally completed using a closed-loop control algorithm to bring the substrate temperature to a stabilization temperature of about 500° C. to about 700° C. Closed-loop control incorporates temperature measurement of the substrate at a given time step in the thermal process in one or more pyrometer zones into the control algorithm in order to fine-tune the power-output of the heating lamps for the subsequent time step. Time steps may be relatively small, for example, 0.1 or 0.01 seconds. The minimum time step size is generally limited by the sampling rate of the temperature sensors used to control the heating process. The use of closed-loop control minimizes error between desired and actual substrate temperatures.

Once the substrate reaches stabilization temperature at the end of initial temperature ramp 301, a stabilization period 302 generally takes place after. The stabilization period 302 is intended to eliminate thermal gradients that have been imprinted on the substrate during the initial temperature ramp 301 by allowing the substrate to equilibrate prior to beginning spike anneal 303, which is the temperature sensitive segment of the thermal process. Non-uniformities in substrate temperature that are present at the beginning of spike anneal 303 are unlikely to be corrected during the process. The stabilization period 302 is between about 5 seconds and about 30 seconds in length, typically between about 10 seconds and about 20 seconds. The substrate temperature is controlled to remain at the stabilization temperature 132, as illustrated in FIG. 2, which may be between about 500° C. to about 700° C., depending on the particular thermal process.

Upon completion of the stabilization period 302, spike anneal 303 then begins. In this example, spike anneal 303 is the segment of the process in which the thermal processing of the substrate actually takes place. An exemplary application of the spike anneal process is to perform the anneal on a substrate after boron implant. In such a case, spike anneal 303 relocates the implanted boron from random locations in the crystal to electrically active sites in the silicon lattice while minimizing the thermal exposure of the substrate. As illustrated in FIG. 2, spike anneal 303 takes place between times 123 and 124 and is followed by a cool-down 304. Ramp rates of the substrate temperature during spike anneal 303 are generally between about 150° C./s and about 300° C./s and peak temperature 133 is about 900° C. to about 1200° C./s, meaning that spike anneal 303 generally only last a few seconds. Such a rapid ramp rate would cause thermal stress-induced substrate damage such as warpage or deformation of the substrate due to temperature differences across the substrate. Hence, there is little time for a control algorithm to correct variation in substrate temperature from the target time-temperature trajectory 100 during the most temperature sensitive segment of the thermal process. Any variation that occurs in substrate temperature from the target temperature during this segment of the rapid thermal process, e.g. overshoot, undershoot or widespike, will reduce the peak temperature repeatability between substrates. Referring back to FIG. 3, spike anneal 303 is then followed by cool-down 304, ending the rapid thermal processing of the substrate.

Closed-Loop Control of Substrate Temperature

Figure 4:
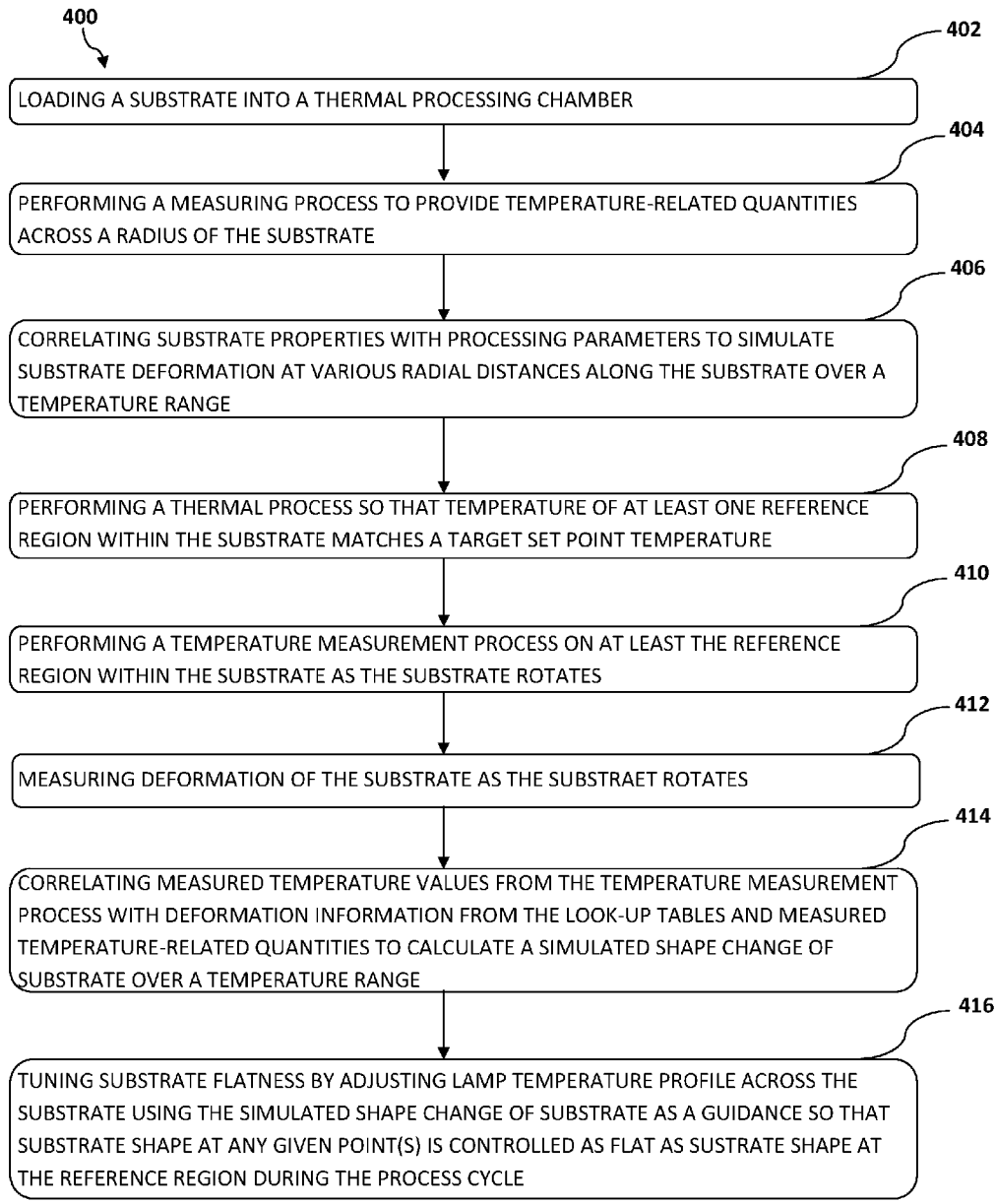
FIG. 4 is a flow chart illustrating an exemplary process sequence for controlling substrate uniformity across a surface of the substrate during RTP according to embodiments of the invention.

FIG. 4 is a flow chart illustrating an exemplary process sequence 400 for controlling substrate uniformity across a surface of the substrate during RTP according to embodiments of the invention. At block 402, the substrate is loaded into a thermal processing chamber, such as the RTP chamber 10 shown in FIG. 1.

At block 404, a measurement process is performed on a substrate placed in the thermal processing chamber to provide one or more temperature-related quantities across the radius of the substrate. The substrate may have a temperature-dependent process previously performed thereon, such as a film deposition process or an implant anneal process. The measurement process measures one or more temperature-related quantities across the radius of the substrate. For example, the temperature-related quantity may include a flatness of a backside surface of the substrate, deformation of the substrate, or in some cases may include a film thickness or resistivity of a film deposited on the substrate.

In one embodiment, the measurement process is a flatness measurement performed at the backside of the substrate. The flatness measurement provides an initial surface topography of the substrate using a measurement device. The measurement of the flatness of the substrate may reveal any deformation of the substrate caused by the residual stress and uneven stress gradient in the layer formed on the substrate. In general, the term "flatness" used herein may be defined as an average of the topographic characteristics across a surface area of the substrate. The measurement device may be the measurement device 48 shown in FIG. 1 that is capable of measuring flatness of the substrate.

The measurement can be done at multiple measurement points along a radius of the substrate or the substrate may be rotated to have the entire substrate surface measured or detected using a scanning beam. The measurements may provide absolute measurement values at a given radial distance of the substrate. Alternatively, the measurements taken at a given radial distance from the center of the substrate can be combined to obtain an average thickness measurement for each radial distance. In either case, the flatness measurement provides an initial surface topography of the substrate at the backside after completion of the temperature-dependent process and prior to performing any subsequent process, for example the initial temperature ramp 301 of the substrate as discussed above with respect to FIG. 2. In some embodiments, the flatness measurement may be performed during thermal processing to provide a surface topography of the substrate at the backside or the frontside during processing. In cases where the frontside is measured, the measured values from the flatness measurement should reflect changes in the measured quantity, e.g., thickness, across the surface of the substrate and reflect at least a one-dimensional profile along the radius of the substrate. The measured flatness values are then provided to a controller, such as the second controller 46 shown in FIG. 1. As will be discussed in more detail below, the measured flatness values can be used, along with the deformation information from look-up tables (block 406) and measured temperature values (block 410), to calculate a simulated flatness correction profile across the plane of the substrate.

At block 406, substrate properties and processing parameters are correlated and these correlations are provided in look-up tables. A control algorithm stored in a controller, such as the second controller 46 shown in FIG. 1, may use look-up tables and the measured values from the flatness measurement discussed at block 404 to predict how the substrate will deform at different substrate temperatures during the thermal processing. For example, the control algorithm may correlate differences in temperature contours of substrates with properties of processed substrates to determine or simulate deformation of the substrate at various radial distances along the substrate, or the degree of deformation at a reference point relative to any given point(s) within the substrate at a specific temperature or within a temperature range. The deformation information can be used at a later stage to calculate the shape change of the substrate over a temperature range.

Exemplary substrate properties may include a thickness of a layer formed on the substrate, layer resistance, layer composition, coefficient of thermal expansion of the layer and the substrate, etc. Exemplary processing parameters may include deposition temperature, deposition time, and chamber pressure, etc. If desired, the step described at block 406 may be performed concurrently with, or prior to block 404.

At block 408, a thermal process, such as the initial temperature ramp 301, the stabilization period 302, or spike anneal 303 as discussed above with respect to FIG. 2, are subsequently performed on the substrate. A real-time adaptive control algorithm stored in a temperature controller, for example the first controller 44 as shown in FIG. 2, calculates the temperature sensed by the pyrometers and provides power set point to a multi zone lamp driver which in turn causes lamps to provide more or less heat (radiation) to substrate so that the temperature of the substrate in the region of interest can be increased, decreased, or maintained at or to a desired temperature set point provided by a specific process recipe. In various embodiments, the temperature controller is configured so that temperature of at least one reference region within the substrate matches a target set point temperature for the processing being performed. The term "reference region" used herein refers to any predetermined region(s) within the substrate where an accurate temperature measurement can be obtained, or where thermal discontinuity issue is less severe as compared to the edge of the substrate. The reference region may be at a given radial distance between the center and the edge of the substrate. In one embodiment, the temperature controller is configured to heat the center of the substrate based on a target set point temperature for the process being performed.

At block 410, during thermal processing, a temperature measurement process is performed on at least a reference region within the substrate as the substrate rotates, using pyrometers such as pyrometers 40 discussed above with respect to FIG. 1. The temperature measurement may be performed constantly throughout the process cycle or at predetermined time intervals, for example at a frequency of about 100 Hz. The temperature measurement process may be taken at a given radial distance between the center and the edge of the substrate (i.e., single measurement) or may be taken at various points concurrently along a radius of the substrate (i.e., multiple measurements). If a single measurement is preferred, the temperature measurement process may be taken at the reference region as discussed at block 408. In one embodiment, the temperature measurement is a single measurement taken at the center of the substrate. Accurate temperature measurements can be obtained at the center of the substrate since the substrate edge may experience greater thermal discontinuity due to the overlap of the substrate and the edge ring that contacts the edge of the substrate. If multiple measurements are preferred, one measurement may be taken at the center of the substrate and two or more measurements may be taken in the vicinity of the center of the substrate to obtain an average temperature measurement for a given region of the substrate. The measured temperature values at the center or a predetermined reference region of the substrate are stored in a controller, for example the first controller 44 as shown in FIG. 2.

At block 412, a second measurement process is performed on the substrate during the thermal processing to provide one or more temperature-related quantities across the radius of the substrate. The second measurement process may be a flatness measurement performed at the backside of the substrate. The flatness measurement provides information about deformation of the substrate of at least the reference region within the substrate and a second region of the substrate as the substrate rotates at a specific target temperature or within a target temperature range. The second region is a region different than the reference region and may be at any given radial distance between the center and the edge of the substrate. In some cases, the second measurement process provides information about actual shape of the substrate across the substrate (e.g., from the center to edge of the substrate). The second flatness measurement may be performed using a laser interferometer or any suitable device that is capable of measuring the deformation of the substrate at the backside. The measured deformation values at the reference region and the second region are stored in a controller, for example the first controller 44 as shown in FIG. 2.

At block 414, the measured temperature values from the temperature measurement process (block 410) are correlated arithmetically with the deformation information from the look-up tables (block 406) and the measured values from the flatness measurement (block 404) to calculate a simulated shape change of the substrate or deformation profile across the plane of the substrate over a temperature range. The simulated shape change of the substrate or deformation profile may be represented by a three-dimensional coordinate system. In some embodiments, the shape differences between the center (or a predetermined reference region) of the substrate and any given point(s) within the rest of the regions of the substrate are correlated with corresponding temperature gradients to determine the power level required to keep the substrate flat over a target temperature range during the thermal processing.

In some embodiments, the measured deformation values from the second measurement process may be further used to enhance the calculation of shape change of the substrate, thereby optimizing the flatness of the substrate during the thermal processing.

At block 416, a tuning algorithm stored in a controller, for example the first controller 44 as shown in FIG. 2, may automatically tune the substrate flatness by adjusting lamp temperature profile across the substrate using the simulated shape change of the substrate as a guidance. Additionally or alternatively, the tuning algorithm may automatically tune the substrate flatness by adjusting lamp temperature profile across the substrate using an empirically determined shape change, that may or may not be modified by simulated results from measured parameters, such as film properties, wafer thickness parameters, etc. The lamp temperature profile may be adjusted throughout the process cycle or at predetermined time intervals. The power supplied to the various heating zones of radiant heat energy is controlled based on the temperature gradient between a reference region (e.g., center) and any given point(s) within the substrate. For example, if a single temperature measurement is taken at the center of the substrate, the topography differences between the center of the substrate and any given point(s) within the substrate are used as offsets to adjust the power level of the heating lamps responsible for the temperature gradient so that any shape deviations away from the desired profile at the center are corrected. In some cases, lamp temperature profile may be adjusted further based on the actual shape of the substrate during the thermal process. As a result, the substrate shape at any given point(s) can be controlled/maintained as flat as the substrate shape at the center (or the predetermined reference region), either at a specific target temperature or within a target temperature range during the process cycle. Therefore, the entire substrate is kept flat during the thermal processing.

Benefits of the present invention include an improved control of temperature uniformity across the substrate by using substrate flatness deviations across the substrate (e.g., center of the substrate vs. edge of the substrate) as a guidance for adjusting the lamp temperature profile across the substrate so that the substrate shape at any given point(s) between the center and edge of the substrate can be controlled as flat as the substrate shape at the center. The invention only requires one temperature measurement for instance in the middle of the substrate and predetermined substrate deformation information to optimize the substrate flatness without the need for temperature offset tuning at locations of the temperature deviation.

While the foregoing is directed to embodiments of the present invention, other and further embodiments of the invention may be devised without departing from the basic scope thereof, and the scope thereof is determined by the claims that follow.

The invention claimed is:

1. A method for processing a substrate in a processing chamber, comprising:
   performing a measuring process to provide one or more temperature-related quantities across a radius of a substrate;
   correlating substrate properties with processing parameters to simulate deformation of the substrate at various radial distances over a temperature range;
   performing a thermal process so that at least one reference region within the substrate has a temperature matching a target set point temperature;
   measuring temperature of at least one reference region within the substrate at various points along a radius of the substrate as the substrate rotates;
   measuring deformation of the substrate of at least the reference region within the substrate and deformation of a region of the substrate different than the reference region as the substrate rotates;
   correlating measured temperature values of at least one reference region with simulated deformation of the substrate and measured deformations of the substrate to calculate a simulated shape change of the substrate over a temperature range; and
   tuning substrate flatness by adjusting lamp temperature profile across the substrate based on the simulated shape change and measured deformations of the substrate.

2. The method of claim 1, wherein tuning substrate flatness comprises using topography differences between the at least one reference region and any given point(s) within the substrate as offsets to adjust power level supplied to heating zones of radiant heat energy responsible for temperature gradient so that any shape deviations away from the desired profile at the reference region are corrected.

3. The method of claim 2, wherein the lamp temperature profile is adjusted so that substrate shape at any given point(s) is kept as flat as substrate shape at the at least one reference region during the thermal process.

4. The method of claim 3, further comprising:
   correlating shape differences between the at least one reference region of the substrate and any given point(s) within the substrate with corresponding temperature gradients to determine the power level required to keep the substrate flat over a target temperature range during the thermal process.

5. The method of claim 1, wherein the measuring process is performed at a backside of the substrate to provides an initial surface topography of the substrate.

6. The method of claim 1, wherein the substrate properties comprise a thickness of a layer formed on the substrate, layer resistance, layer composition, or coefficient of thermal expansion of the layer and the substrate, and the processing parameters comprise deposition temperature, deposition time, or chamber pressure.

7. The method of claim 1, wherein the reference region is located at a given radial distance between a center of the substrate and an edge of the substrate.

8. The method of claim 7, wherein measuring a temperature of at least one reference region is performed constantly throughout the thermal process or at predetermined time intervals.

9. The method of claim 1, wherein the reference region is located at a center of the substrate.

10. A method for processing a substrate in a processing chamber, comprising:
    performing a measuring process to determine an initial surface topography of a substrate;
    calculating a simulated deformation profile for the substrate over a temperature range based on the initial surface topography of the substrate and substrate properties;
    matching temperature of a reference region within the substrate to a target set point temperature during a thermal process;
    calculating a simulated shape change of the substrate based on a temperature measurement of the reference region and the simulated deformation profile;
    tuning substrate flatness by adjusting lamp temperature profile across the substrate based on the simulated shape change of the substrate; and
    correlating shape differences between the reference region of the substrate and any given point(s) within the substrate with corresponding temperature gradients to determine the power level required to keep the substrate flat over a target temperature range during the thermal process.

11. The method of claim 10, wherein tuning a substrate flatness comprises using topography differences between the reference region and any given point(s) within the substrate as offsets to adjust power level supplied to heating zones of radiant heat energy responsible for temperature gradient so that any shape deviations away from the desired profile at the reference region are corrected.

12. The method of claim 11, wherein the lamp temperature profile is adjusted so that substrate shape at any given point(s) is kept as flat as substrate shape at the reference region during the thermal process.

13. The method of claim 10, further comprising:
measuring deformation of the substrate of at least the reference region within the substrate and a second region of the substrate as the substrate rotates, wherein the second region is different than the reference region.

14. The method of claim 13, wherein the reference region and the second region are located at a given radial distance between a center of the substrate and an edge of the substrate.

15. The method of claim 14, wherein the reference region is located at a center of the substrate.

16. The method of claim 10, wherein the substrate properties comprise a thickness of a layer formed on the substrate, layer resistance, layer composition, or coefficient of thermal expansion of the layer and the substrate.

17. A method for processing a substrate in a processing chamber, comprising:
performing a measuring process to provide one or more temperature-related quantities across a radius of a substrate;
correlating substrate properties with processing parameters to simulate deformation of the substrate at various radial distances over a temperature range;
performing a thermal process so that at least one reference region within the substrate has a temperature matching a target set point temperature;
measuring temperature of at least one reference region within the substrate as the substrate rotates;
measuring temperature-related quantities of the substrate of at least the reference region within the substrate and temperature-related quantities of a region of the substrate different than the reference region as the substrate rotates;
correlating measured temperature values of at least one reference region with simulated deformation of the substrate and measured temperature-related quantities of the substrate to calculate a simulated shape change of the substrate over a temperature range; and
tuning substrate flatness by adjusting lamp temperature profile across the substrate based on the simulated shape change and measured temperature-related quantities of the substrate.

18. The method of claim 17, wherein the temperature-related quantities comprise a flatness of the substrate, deformation of the substrate, film thickness, or resistivity of a film deposited on the substrate.

19. The method of claim 17, wherein tuning substrate flatness comprises using topography differences between the at least one reference region and any given point(s) within the substrate as offsets to adjust power level supplied to heating zones of radiant heat energy responsible for temperature gradient.

* * * * *